Feb. 22, 1966 R. H. JENKINS 3,237,021

TRIGGER CIRCUITS

Filed Sept. 15, 1961

INVENTOR.
ROBERT H. JENKINS
BY
Carl V. Olson
Attorney

United States Patent Office 3,237,021
Patented Feb. 22, 1966

3,237,021

TRIGGER CIRCUITS

Robert H. Jenkins, Audubon, N.J., assignor to Radio Corporation of America, a corporation of Delaware Filed Sept. 15, 1961, Ser. No. 138,400
4 Claims. (Cl. 307—88.5)

Figure 1:
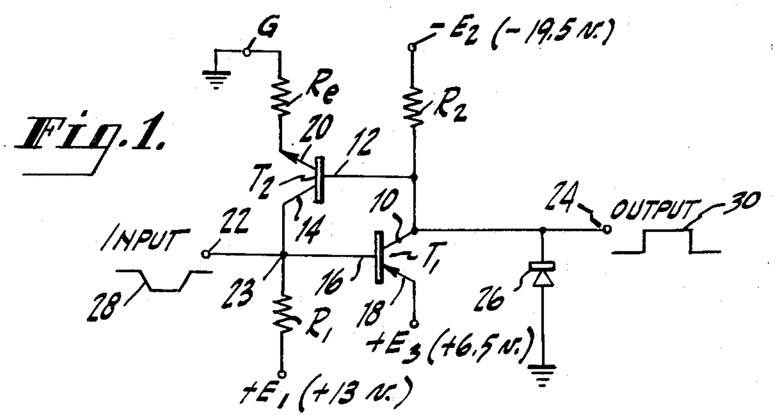

This invention relates to trigger circuits and particularly to current-sensitive trigger circuits.

It is an object of the invention to provide an improved transistor trigger circuit which produces a square output pulse even though the input pulse has sloping leading and trailing edges.

It is another object to provide an improved trigger circuit which produces an inverted square output pulse having a duration corresponding with the duration of an input pulse.

It is a further object to provide an improved trigger circuit which produces a square output pulse having a duration corresponding with the time during which the input signal current exceeds a predetermined trigger current "turn-on" threshold and remains greater than a predetermined current "turn-off" threshold.

According to an example of the invention, first and second transistors are cross connected so that the collector of the first transistor is connected to the base of the second transistor, and the collector of the second transistor is connected to the base of the first transistor. The base and collector of the first transistor are connected throough respective resistors to respective bias potential terminals. The emitter of the first transistor is connected to another bias potential terminal, and the emitter of the second transistor is connected through an emitter resistor to a bias potential terminal which may be a reference potential terminal. Both transistors are biased to be normally nonconducting. An input signal is applied to the base of the first transistor in a polarity to cause the first transistor to conduct. The voltage at the collecor of the first transistor and the base of the second transistor then changes in a direction to cause the second transistor to conduct, whereupon the potential at the collector of the second transistor and the base of the first transistor changes in a direction to make the first transistor conduct to saturation. The values of the bias potentials and the value of the emitter resistor of the second transistor are selected so that the collector current drawn by the second transistor is insufficient to keep the first transistor conducting after the termination of the input signal.

Figures 2A, 2B:
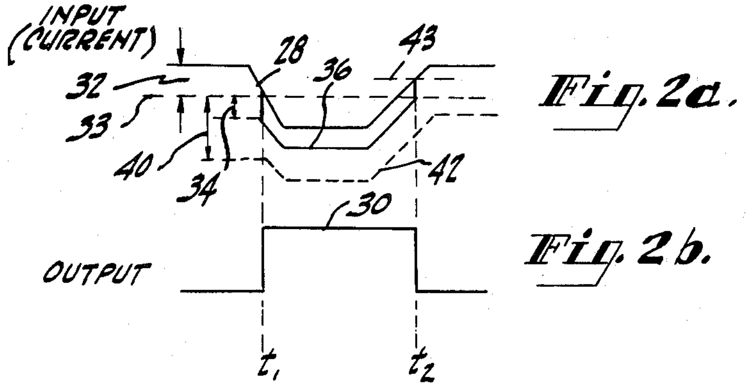
Figure 3:
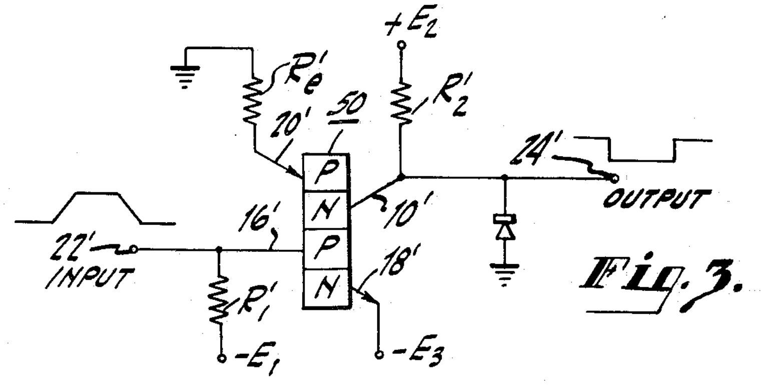
Figure 4:
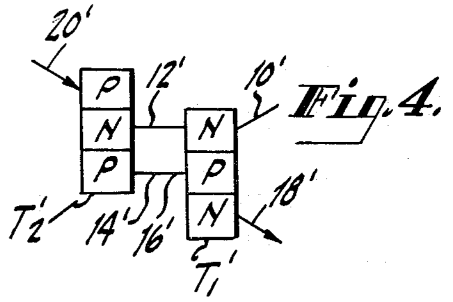

In the drawings:

FIGURE 1 is a circuit diagram of a presently preferred example of a trigger circuit according to the invention;

FIGURES 2*a* and 2*b* show a chart of input and output waveforms which will be referred to in describing the operation of the circuit of FIGURE 1;

FIGURE 3 is a circuit diagram of a form of the invention incorporating a unitary semiconductor device in place of two separate transistors; and FIGURE 4 is a diagram which will be referred to in describing the equivalency of the semiconductor devices in the circuits of FIGURES 1 and 3.

FIGURE 1 shows a trigger circuit including two transistors $T_1$ and $T_2$ of opposite conductivity types. The collector of each of the two transistors is connected to the base of the other transistor. In other words, the collector 10 of first, PNP type transistor $T_1$ is connected to the base 12 of second, NPN type transistor $T_2$, and the collector 14 of the second transistor $T_2$ is connected to the base 16 of the first transistor $T_1$. The base 16 of transistor $T_1$ is connected through a first resistor $R_1$ to a first bias potential terminal $+E_1$. The collector 10 of transistor $T_1$ is connected through a second resistor $R_2$ to a second bias potential terminal $-E_2$. The emitter 18 of transistor $T_1$ is connected to a third bias potential terminal $+E_3$. The emitter 20 of transistor $T_2$ is connected through an emitter resistor $R_e$ to a fourth bias potential terminal or reference potential terminal G. An input terminal 22 is connected through a junction point 23 to the base 16 of transistor $T_1$. The collector 10 of transistor $T_1$ is connected to an output terminal 24 and through a clamping diode 26 to a bias potential reference point such as circuit ground.

In the operation of the circuit of FIGURE 1, the transistors $T_1$ and $T_2$ are normally biased to be nonconducting. A negative polarity input signal 28 is applied to the input terminal 22 and to the base 16 of transistor $T_1$. The input signal causes current to flow from the $+E_1$ terminal through resistor $R_1$ to the input terminal 22. This flow of current causes a voltage drop to be developed across resistor $R_1$. When the potential at the base 16 of transistor $T_1$ falls to a value less than the $+E_3$ bias potential (+6.5 volts) on the emitter 18, transistor $T_1$ starts to conduct, allowing current to flow from the $+E_3$ terminal, through the emitter-collector circuit of transistor $T_1$ and through collector resistor $R_2$ to the $-E_2$ bias terminal. The current through resistor $R_2$ causes the potential at the collector 10 of transistor $T_1$ and the base 12 of transistor $T_2$ to rise (become less negative), which causes the transistor $T_2$ to be rendered conductive. When transistor $T_2$ conducts, it draws current in the path from bias terminal $+E_1$ through resistor $R_1$, through the collector-emitter circuit of $T_2$ and through resistor $R_e$ to ground. Transistor $T_2$ also draws base current from base 16 of transistor $T_1$. The effect of conduction by transistor $T_2$ is to further lower the potential at the base 16 of transistor $T_1$, and to thus cause $T_1$ to conduct to saturation.

To summarize, once the input signal causes transistor $T_1$ to start conducting, transistor $T_2$ provides regenerative feedback which makes transistor $T_1$ conduct fully and generate the abrupt or vertical leading edge of an inverted output signal 30.

The circuit of FIGURE 1 is a current sensitive trigger circuit. The circuit is triggered when the input current signal 28 causes enough current to be drawn through a first resistor $R_1$ from bias terminal $+E_1$ to lower the voltage at base 16 of transistor $T_1$ a little below the potential of the emitter bias terminal $+E_3$. Therefore, switching occurs at a time $t_1$ (FIGURE 2A) when the input signal 28 at input terminal 22 causes the drawing of an amount of "turn-on" current 32 which exceeds the threshold current level 33. This input turn-on current 32 for transistor $T_1$ has a value slightly more than the value given by the formula $$\frac{(+E_1)-(+E_3)}{R_1}$$

When transistor $T_2$ becomes conductive, transistor $T_2$ draws an additional amount of current 34 into its collector 14. This additional current 34 is drawn from the base 16 of transistor $T_1$ and also through resistor $R_1$ from the $+E_1$ bias terminal. The additional current drawn by transistor $T_2$ results in transistor $T_1$ being maintained in a saturated conducting condition. The total current drawn from the junction point 23 due to the presence of the input signal 28 and due to conduction by transistor $T_2$ is represented by the waveform 36 in FIGURE 2A.

During the trailing edge of the input signal 28, a point is reached at time $t_2$ where the total current 36 drawn from the junction point 23 to the input terminal 22 and to the transistor $T_2$ is less than the current threshold value 33 required to keep transistor $T_1$ conductive. At this time $t_2$, the conduction through transistor $T_1$ is reduced, and then the regenerative action of transistor $T_2$ causes transistor $T_1$ to be abruptly rendered nonconductive. The inverted output pulse 30 (FIGURE 2*b*) available at output terminal 24 is thus seen to have abrupt vertical leading and trailing edges occurring at time $t_1$ and time $t_2$, respectively. It is seen that the input current turn-on level at time $t_1$ is at 33, and the input current turn-off level at time $t_2$ is at 43.

The positive feedback regenerative current 34 drawn by transistor $T_2$ is relatively unaffected by transistor characteristics and is accurately determined by the base bias potential (minus the base-emitter drop) divided by the value of emitter resistance. The regenerative collector current drawn by transistor $T_2$ when transistor $T_1$ is conductive is thus determined by the value of bias voltage $+E_3$ (less the small internal emitter-collector drop in transistor $T_1$ and the small internal base-emitter drop of transistor $T_2$) divided by the value of emitter resistor $R_e$.

The value of the bias potential $+E_3$ and the value of emitter resistor $R_e$ are selected so that the collector current 34 drawn by transistor $T_2$, when transistor $T_1$ is conductive, is less than the input turn-on current 32. When this rule is followed, the circuit operates as desired in generating an output pulse having a duration corresponding with that duration of the input pulse which exceeds the turn-on level 33 and the turn-off level 43.

On the other hand, an undesired bistable mode of operation obtains when the current drawn by transistor $T_2$ exceeds the input turn-on current 32 as a result of the employment of a resistor $R_e$ having too small a value. If the collector current of transistor $T_2$ has a value 40 (rather than the value 34) which is greater than the turn-on current 32, the total current drawn from point 23 is as represented by the dotted waveform 42. It is seen that the dotted waveform 42 does not return to the threshold level 33 after the input pulse 28 has terminated. Therefore, if the emitter resistor $R_e$ has too small a value, the transistors will undesirably remain conductive indefinitely after termination of the input pulse.

For proper operation of the circuit of FIGURE 1 it is important that the input signal 28 be supplied from a current source, rather than a voltage source. A current source is required because the current drawn by the feedback transistor $T_2$ must be able to change the base-emitter voltage drop of transistor $T_1$ in order to cause a change in the base current of transistor $T_1$. The change in base-emitter voltage drop will not occur if the input signal 28 is supplied from a voltage source, i.e., a source having zero internal impedance. The change in current through resistor $R_1$ caused by the change in base-emitter drop after transistor $T_1$ begins conducting should be small by comparison with the current which transistor $T_2$ is capable of drawing.

Solely by way of example, a circuit according to FIGURE 1 has been successfully operated with circuit elements as follows:

| | | |
|---|---|---|
| Transistor $T_1$ | | 2N1300 |
| Transistor $T_2$ | | 2N585 |
| Resistor $R_1$ | ohms | 2700 |
| Resistor $R_2$ | do | 4700 |
| Resistor $R_e$ | do | 4300 |

FIGURE 3 shows a trigger circuit which is similar to the circuit of FIGURE 1 except in that a unitary semiconductor device 50 replaces the two transistors in the circuit of FIGURE 1, and in that the polarities and conductivity types in the circuit of FIGURE 3 are reversed, with the result that a positive-going input pulse results in a negative-going output pulse. The semiconductor device 50 in the circuit of FIGURE 3 is a four-layer PNPN device having four terminals.

The equivalence of the semiconductor device 50 and the two transistors may be explained with reference to the diagram of FIGURE 4. FIGURE 4 shows two transistors $T_1'$ and $T_2'$ which correspond to the transistors $T_1$ and $T_2$ in FIGURE 1 except that they are of reversed conductivity types compared with the transistors $T_1$ and $T_2$. It is seen in FIGURE 4 that the N-type collector of transistor $T_1'$ is directly connected to the N-type base of transistor $T_2'$, and that the P-type collector of transistor $T_2'$ is directly connected to the P-type base of the transistor $T_1'$. The connected N-type regions of the two transistors can be viewed as one N-type region, and the connected P-type regions of the two transistors can be viewed as one P-type region. Therefore, the semiconductor configuration of FIGURE 4 can be simplified to the unitary structure as illustrated by the device 50 of the circuit of FIGURE 4. The semiconductor device 50 effectively constitutes two transistors of opposite conductivity types wherein the collector of each one is common to the base of the other one.

In operation, the circuit of FIGURE 3 is the same as the circuit of FIGURE 1 except that the polarities of the bias sources are reversed and the conductivity types of the semiconductor devices are also reversed, so that the input and output signals are likewise reversed in polarity.

It is thus seen that according to this invention there is provided a simple, economical and effective trigger circuit which is current sensitive, and which is operative to generate a square output pulse upon receipt of an input pulse that may have variously sloping leading and trailing edges.

What is claimed is:

1. A trigger circuit comprising first and second transistors of opposite conductivity types each having base, collector and emitter terminals, means effectively cross connecting the base terminals and collector terminals of said two transistors, bias potential terminals, means including resistors connecting said transistor terminals to said bias potential terminals, said last named means including an emitter resistor connected from the emitter of said second transistor to a bias potential terminal, said transistors being normally nonconductive, means to apply an input signal current to the base of said first transistor which current reaches and exceeds a threshold value at which the first transitsor is caused to become conductive, whereby the potential at the collector electrode of the first transistor and the base electrode of the second transistor changes in a direction to cause the second transistor to become conductive, whereupon the potential at the collector electrode of the second transistor and the base electrode of the first transistor changes in a direction to cause the first transistor to conduct to saturation, the values of bias potentials and the value of said emitter resistor being selected so that the collector current drawn by said second transistor is less than said current threshold value and is insufficient to keep said first transistor conducting after the termination of said input signal, and means to derive an output signal from the collector electrode of said first transistor.

2. A trigger circuit comprising a first transistor of one conductivity type having a base connected through a first resistor to a first bias potential terminal, a collector connected through a second resistor to a second bias potential terminal, and an emitter connected to a third bias potential terminal, a second transistor of opposite conductivity type having a base connected to the collector of said first transistor, a collector connected to the base of said first transistor and an emitter connected through an emitter resistor to a fourth bias potential terminal, said transistors being normally biased to be nonconductive, means to apply an input signal current to the base of said first transistor which current reaches and exceeds a turn-on incremental current at a value at which the voltage drop in said first resistor causes said first transistor to become conductive, whereby the potential at the connection between the collector of the first transistor and the base of the second transistor changes in a direction to cause the second transistor to become conductive, whereupon the potential at the connection between the collector of the second transistor and the base of the first transistor changes in a direction to cause the first transistor to conduct to saturation, the values of potential at said third and fourth bias potential terminals and the value of said emitter resistor being selected so that the collector current drawn by said second transistor is less than said turn-on incremental current, and so that the first transistor turns off when the sum of the input signal current and the collector current of the second transistor falls below said threshold current value, and means to derive an output signal from the collector of said first transistor.

3. A current sensitive trigger circuit comprising first and second transistors of opposite conductivity types each having a base, a collector and an emitter, bias potential terminals, a base resistor connected from the base of the first transistor and the collector of the second transistor to a bias potential terminal, a collector resistor connected from the collector of the first transistor and the base of the second transistor to another bias potential terminal, and an emitter resistor connected from the emitter of the second transistor to a point of reference potential, a connection from the emitter of the first transistor to yet another bias potential terminal, said transistor being normally biased to be nonconductive, means to apply an input signal current to the base of said first transistor to cause it to become conductive, whereby the potential at the collector of the first transistor and the base of the second transistor changes in a direction to cause the second transistor to become conductive, whereupon the potential at the collector of the second transistor and the base of the first transistor changes in a direction to cause the first transistor to condut to saturation, the values of potential at said bias potential terminals and the value of said emiter resistor being selected so that the collector current drawn by said second transistor is insufficient to keep said first transistor conducting after the termination of said input signal, and means to derive an output signal from the collector of said first transistor.

4. A trigger circuit as defined in claim 3, and in addition, a clamping diode connected from the collector of said first transistor to a point of reference potential.

References Cited by the Examiner

UNITED STATES PATENTS

| | | | |
|---|---|---|---|
| 2,655,609 | 10/1953 | Shockley | 307—88.5 |
| 2,770,732 | 11/1956 | Chong | 307—88.5 |
| 2,838,617 | 6/1958 | Tummers et al. | 307—88.5 X |
| 2,890,353 | 6/1959 | Van Overbeek et al. | 307—88.5 |
| 2,896,094 | 7/1959 | Moody et al. | 307—88.5 |
| 2,901,639 | 8/1959 | Woll | 307—88.5 |
| 2,958,789 | 11/1960 | Lee | 307—88.5 |
| 3,009,069 | 11/1961 | Lee | 307—88.5 |
| 3,016,468 | 1/1962 | Moraff | 307—88.5 |
| 3,025,415 | 3/1962 | Clapper | 307—88.5 |
| 3,065,360 | 11/1962 | Vallese | 307—88.5 |

ARTHUR GAUSS, *Primary Examiner.*

JOHN W. HUCKERT, *Examiner.*